(12) United States Patent
Kubota et al.

(10) Patent No.: US 8,980,117 B2
(45) Date of Patent: Mar. 17, 2015

(54) PIEZOELECTRIC MATERIAL

(75) Inventors: Makoto Kubota, Yokohama (JP);
Toshihiro Ifuku, Yokohama (JP);
Hiroshi Funakubo, Yokohama (JP);
Keisuke Yazawa, Yokohama (JP);
Hiroshi Uchida, Tokyo (JP); Takashi Iijima, Tsukuba (JP); Bong-yeon Lee, Tsukuba (JP)

(73) Assignees: Canon Kabushiki Kaisha, Tokyo (JP);
Tokyo Institute of Technology, Tokyo (JP); Sophia University, Tokyo (JP);
National Institute of Advanced Industrial Science and Technology, Tokyo (JP)

( * ) Notice: Subject to any disclaimer, the term of this patent is extended or adjusted under 35 U.S.C. 154(b) by 867 days.

(21) Appl. No.: 13/142,602

(22) PCT Filed: Jan. 1, 2010

(86) PCT No.: PCT/JP2010/050295
§ 371 (c)(1),
(2), (4) Date: Jun. 29, 2011

(87) PCT Pub. No.: WO2010/079838
PCT Pub. Date: Jul. 15, 2010

(65) Prior Publication Data
US 2011/0268965 A1    Nov. 3, 2011

(30) Foreign Application Priority Data
Jan. 7, 2009    (JP) .................................. 2009-001964

(51) Int. Cl.
*H01L 41/18*    (2006.01)
*C04B 35/111*   (2006.01)
(Continued)

(52) U.S. Cl.
CPC ............... *C04B 35/111* (2013.01); *C04B 35/01* (2013.01); *H01L 41/1878* (2013.01);
(Continued)

(58) Field of Classification Search
CPC ...... C04B 35/475; C04B 35/26; C04B 35/44; H01I 41/1878; H01I 41/0805; H01I 41/316
USPC .......... 252/62.9 R, 62 PZ; 310/311; 501/134; 427/100, 585; 428/938, 689
See application file for complete search history.

(56) References Cited

U.S. PATENT DOCUMENTS 7,997,692 B2    8/2011  Sakashita et al.
8,529,785 B2 *  9/2013  Kubota et al. .......... 252/62.9 PZ
(Continued)

FOREIGN PATENT DOCUMENTS

EP    2145975       * 1/2010
JP    2007-287739   * 11/2007
(Continued)

OTHER PUBLICATIONS

Yuzhi Jiang et al., "Microstructure and Electric Propeties of (1-x)Bi(Sc0.7Zn0.1.125Ti0.125)O3-xPbTiO3 Ceramics," 380 Ferroelectric 130-134, 2009.*
(Continued)

*Primary Examiner* — Carol M Koslow
(74) *Attorney, Agent, or Firm* — Fitzpatrick, Cella, Harper & Scinto

(57) ABSTRACT

Provided is a piezoelectric material having a high Curie temperature and satisfactory piezoelectric characteristics, the piezoelectric material being represented by the following general formula (1):

$$A(Zn_xTi_{(1-x)})_yM_{(1-y)}O_3 \qquad (1)$$

where A represents a Bi element, M represents at least one element selected from Fe, Al, Sc, Mn, Y, Ga, and Yb; x represents a numerical value of $0.4 \le x \le 0.6$; and y represents a numerical value of $0.17 \le y \le 0.60$.

7 Claims, 1 Drawing Sheet

(51) Int. Cl.
*C04B 35/01* (2006.01)
*H01L 41/187* (2006.01)
*H01L 41/316* (2013.01)

(52) U.S. Cl.
CPC ...... *H01L 41/316* (2013.01); *C04B 2235/3217* (2013.01); *C04B 2235/3225* (2013.01); *C04B 2235/3232* (2013.01); *C04B 2235/3262* (2013.01); *C04B 2235/327* (2013.01); *C04B 2235/3284* (2013.01); *C04B 2235/3298* (2013.01); *Y10S 428/938* (2013.01)
USPC ............... 252/62.9 R; 252/62.9 PZ; 310/311; 427/100; 427/585; 428/938; 428/689

(56) References Cited

U.S. PATENT DOCUMENTS

| | | | |
|---|---|---|---|
| 2007/0241642 | A1 | 10/2007 | Miyazawa et al. |
| 2008/0089832 | A1 | 4/2008 | Aoki et al. |
| 2010/0025617 | A1* | 2/2010 | Kubota et al. .......... 252/62.9 PZ |

FOREIGN PATENT DOCUMENTS

| KR | 10-2009-0091939 | * | 8/2009 |
|---|---|---|---|
| WO | 2008/088086 A1 | | 7/2008 |

OTHER PUBLICATIONS

Chien-Chih Huang et al., "Phase Transitions and Dielectric Properties in Bi(zn1/2Ti1/2)O3-ABO3 perovskite Solid Solutions", 102, J. Appl. Phys. 044103: 1-5, ( Aug. 2007).*
Matthew R. Suchomel et al., "Bi2znTiO6: A Lead-Free Closed-Shell Polar Perovskite with Calculated Ionic Polarization of 150 muC cm-2," 18 Chem. Mater. 4987-4989 (Sep. 2006).*
Joel Zylberberg et al, "Bismuth Aluminate: A New Hifg-Tc Lead-Free Piezo-/ferroelectric," 19 Chem. Mater. 6385-6390 (Nov. 2007).*
translation for KR 10-2009-0091939, dated Aug. 31, 2009.*
Chien-Chih Huang et al., "Phase Transitions and Dielectric Properties in Bi(Zn1/2 Ti1/2)O3-ABO3 Perovskite Solid Solutions," Applications of Ferroelectrics, pp. 1-3 (Feb. 2008).
G.D. Hu et al., "Low Leakage Current and Enhanced Ferroelectric Properties of Ti and Zn Codoped BiFeO3 Thin Film," Appl. Phys. Lett. 92, 192905 (1-3) (May 2008).
Office Action in Chinese Application No. 201080004003.2 (dated Apr. 19, 2013).
Communication pursuant to Article 94(3) EPC in European Application No. 10702546.2 (dated Jul. 25, 2014).

* cited by examiner

PIEZOELECTRIC MATERIAL

TECHNICAL FIELD

The present invention relates to a piezoelectric material, in particular, a novel piezoelectric material made of a lead-free metal oxide.

BACKGROUND ART

As piezoelectric ceramics, $ABO_3$-type ceramics such as lead zirconate titanate (hereinafter, referred to as "PZT") is generally used.

However, PZT contains lead as an A-site element, and hence its effect on the environment is considered as a problem. Therefore, a piezoelectric material using a perovskite-type oxide containing no lead has been proposed.

For example, as a piezoelectric substance made of a perovskite-type oxide containing no lead, "Chemistry of Materials" 2006, Vol. 18, No. 21, pp. 4987-4989 describes $Bi(Zn_{0.5}Ti_{0.5})O_3$ as a Bi-based material. However, it is difficult to synthesize materials of $Bi(Zn_{0.5}Ti_{0.5})O_3$ and to polarize $Bi(Zn_{0.5}Ti_{0.5})O_3$ due to a high Curie temperature, and hence the piezoelectric performance thereof has not been clarified.

Further, a piezoelectric material containing $BiFeO_3$ as a main component has been proposed. For example, Japanese Patent Application Laid-Open No. 2007-287739 discloses a $BiFeO_3$-based material containing La in an A-site. $BiFeO_3$ is a satisfactory ferroelectric substance, and reportedly exhibits a high amount of remnant polarization at low temperatures. However, $BiFeO_3$ has a problem in that the displacement amount cannot be kept large under an electric field application due to its low insulation properties, which can be also found in view of containing Fe.

Further, "Chemistry of Materials" 2007, Vol. 19, No. 26, pp. 6385-6390 discloses a $BiAlO_3$ piezoelectric material obtained by a high-pressure synthesis method. However, the piezoelectric performance of $BiAlO_3$ has also not reached a practically applicable range yet.

DISCLOSURE OF THE INVENTION

The present invention has been achieved in order to solve the above problems, and an object of the present invention is to provide a Bi-based piezoelectric material excellent in piezoelectric performance.

A piezoelectric material for solving the above-mentioned problem is characterized in that the piezoelectric material is formed of a perovskite-type complex oxide represented by the following general formula (1), and the crystal system of the perovskite-type complex oxide contains at least a monoclinic structure:

  (1)

where A represents a Bi element, M represents at least one element selected from Fe, Al, Sc, Mn, Y, Ga, and Yb; x represents a numerical value of $0.4 \leq x \leq 0.6$; and y represents a numerical value of $0.17 \leq y \leq 0.60$.

According to the present invention, a piezoelectric material having satisfactory piezoelectric characteristics can be provided, the material having a monoclinic structure in which the rotation of a polarization axis becomes sensitive to an external electric field, compared with that in other crystal systems. The piezoelectric material of the present invention has a high dielectric constant because the material contains a monoclinic structure and has a low dielectric loss, and hence, the piezoelectric material of the present invention is suitable for a piezoelectric device. Further, the piezoelectric material of the present invention does not influence the environment because the material does not use lead. The piezoelectric material of the present invention does not use alkali metals, and hence, the material is advantageous even in terms of durability when used in a piezoelectric device.

Further features of the present invention will become apparent from the following description of exemplary embodiments with reference to the attached drawings.

BEST MODE FOR CARRYING OUT THE INVENTION

Figure 1:
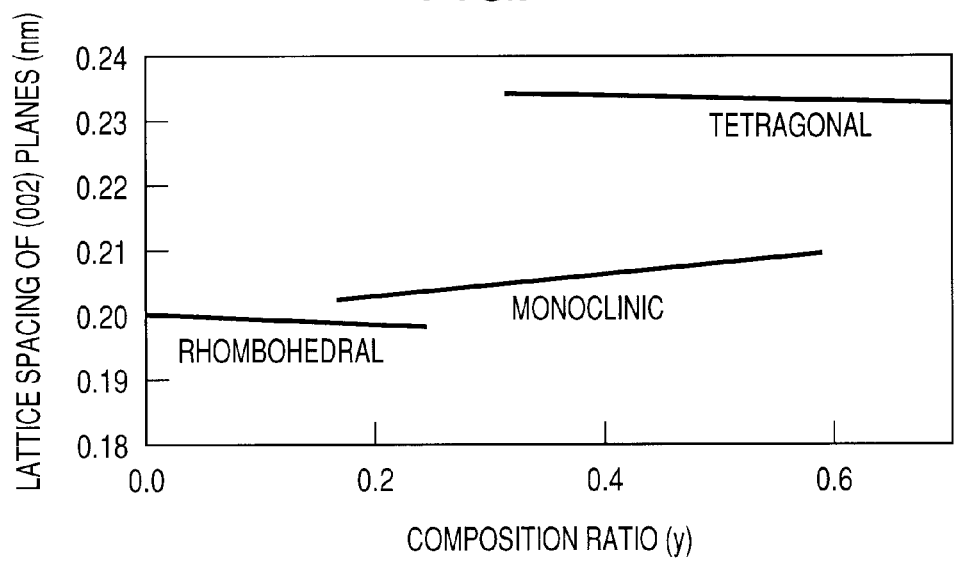
FIG. 1 is a graph schematically illustrating a mixed state of crystal systems of a perovskite-type complex oxide represented by the general formula (1), which is a piezoelectric material of the present invention.

Hereinafter, an embodiment for carrying out the present invention is described.

The present invention provides a novel piezoelectric material having satisfactory piezoelectric characteristics, based on a Bi-based piezoelectric material excellent in piezoelectric performance.

The piezoelectric material according to the present invention is represented by the following general formula (1):

  (1)

where A represents a Bi element, M represents at least one element selected from Fe, Al, Sc, Mn, Y, Ga, and Yb; x represents a numerical value of $0.4 \leq x \leq 0.6$; and y represents a numerical value of $0.17 \leq y \leq 0.60$.

The perovskite-type oxide is generally represented by a chemical formula: $ABO_3$. In the perovskite-type oxide, elements A and B in the shape of an ion occupy particular positions of a unit cell called an A-site and a B-site, respectively. For example, in a unit cell of a cubic crystal system, the element A is positioned at the vertex of the cube and the element B is positioned at a body center. O elements occupy a face-centered position as anions of oxygen.

The compound represented by the above general formula (1) refers to a solid solution of a plurality of perovskite-type oxides represented by $A(Zn_xTi_{(1-x)})O_3$ and $AMO_3$. In the above general formula (1), A is a metal element mainly positioned at the A-site and $(Zn_xTi_{(1-x)})$ and M are elements positioned mainly at the B-site.

In the above general formula (1), the number of metals is the same in the A-site and the B-side in terms of an ideal composition ratio. When the number of metals at the A-site is larger or smaller than that at the B-site, excessive amounts of metals are precipitated at a crystal grain boundary or a deficient content causes a defective site, which may have, for example, an adverse effect on insulation properties. The allowable range of a molar ratio of the amount of metals at the A-site with respect to that at the B-site, i.e. A site/B site is 0.95 to 1.30 both inclusive. When the amount of metals at the A-site departs from the above range, piezoelectricity as well as insulation properties are degraded remarkably.

A is formed of Bi. In this case, a single substance of $A(Zn_xTi_{(1-x)})O_3$ has a tetragonal structure with a large aspect ratio.

x representing the ratio of Zn to Ti is 0.4≤x≤0.6, and the most preferred value of x is 0.5. If Zn is present as a divalent cation and Ti is present as a tetravalent cation in a crystal lattice, because the balance of charge is good when x is 0.5, the insulation properties of the entire oxide are enhanced. Depending upon the B-site element and the kind of a dopant, x may be changed in a range of 0.4 to 0.6 for the purpose of enhancing insulation properties.

M is selected from any of one of Fe, Al, Sc, Mn, Y, Ga, and Yb in the general formula (1), and a combination thereof. More preferably, in the general formula (1), M is formed of one of Fe, Al, and both the elements.

In a single substance, $A(Zn_xTi_{(1-x)})O_3$ that has a tetragonal structure and $AMO_3$ that has a non-tetragonal structure are formed into a solid solution, whereby the piezoelectric effect of the solid solution with respect to an external electric field increases. At this time, when the range of y representing a solid solution ratio between both the structures is 0.17≤y≤0.60, the piezoelectric performance better than that of a single substance is obtained. When the value of y is smaller than 0.17, the influence of the properties of an $AMO_3$ single substance becomes large, with the result that a dielectric loss may be increased. On the contrary, when the value of y is larger than 0.6, the influence of properties of an $A(Zn_xTi_{(1-x)})O_3$ single substance becomes larger, with the result that a sintering density may be decreased.

Further, when the range of y is 0.17≤y≤0.44, the piezoelectric material of the present invention approaches the morphotropic phase boundary between a tetragonal structure and a non-tetragonal structure, i.e., a region where a monoclinic structure is dominant. In the morphotropic phase boundary or the composition in the vicinity thereof, switching of a polarization axis direction may easily occur, and hence, a large piezoelectric effect can be expected.

When A is made of a Bi element, the symmetry of a perovskite skeleton constituted of an A-site element and O elements increases, whereby the stability of a piezoelectric material with respect to the external stimulus is enhanced. Further, the effects of raising the Curie temperature of the piezoelectric material and enlarging a fluctuation range of internal polarization due to the strong bonding peculiar to the Bi element are obtained.

When A is made of only a Bi element, a perovskite skeleton constituted of an A-site element and O elements is electrically stabled.

Further, an element other than Bi may be contained in A for the purpose of facilitating the production of the piezoelectric material of the present invention, and adjusting the physical properties of the piezoelectric material of the present invention. It is preferred that an element to be contained in A be a trivalent metal element. Examples thereof include trivalent lanthanoide elements such as La, Ce, Pr, Tm, Yb and Dy. It is desired that the content of an element to be contained in A be 30 mol % or less.

It should be noted that, even if the material illustrated above is further added to A, when the ratio of Bi is less than 70 mol %, the insulation properties of the piezoelectric material of the present invention may be decreased. The mol % herein is the amount of substance of a specified element with respect to the total amount of substance occupying a specified site represented by a percentage.

The Curie temperature desired in the piezoelectric material of the present invention is 600° C. or lower, and more preferably 450° C. to 600° C. both inclusive. If the Curie temperature is 450° C. or higher, when the piezoelectric material is used in a device, a material with less fluctuation in characteristics depending upon temperature can be provided. Further, if the Curie temperature is 600° C. or lower, a material that can be polarized easily during the formation of a device can be provided.

The crystal system of the piezoelectric material of the present invention represented by the general formula (1) is characterized by containing at least a monoclinic structure. A more preferred crystal system is one of a mixed system having a monoclinic structure and a rhombohedral structure and a mixed system having a monoclinic structure and a tetragonal structure.

In the present invention, the structures of a monoclinic, a rhombohedral, and a tetragonal are defined as follows. The following "=" indicates a substantial equality. A β-angle represents an angle formed by an a-axis and a c-axis of a crystal lattice.

Rhombohedral: a-axis length=c-axis length, and β-angle≠90°,

Monoclinic crystal: a-axis length=c-axis length, and a β-angle≠90°

Tetragonal: a-axis length=c-axis length, and a β-angle=90°

FIG. 1 is a graph schematically illustrating a mixed state of crystal systems in a perovskite-type complex oxide represented by the general formula (1), which is the piezoelectric material of the present invention, taking a vertical axis as a lattice spacing (=c-axis length/2) of (002) planes and a horizontal axis as a composition ratio y. When lattice constants of a tetragonal and a rhombohedral are compared in the piezoelectric material of the present invention, it is understood that a change in a c-axis length is particularly larger, compared with a change in an a-axis length and a b-axis length. More specifically, referring to FIG. 1, it is understood that there is a large difference in volume per unit cell between a rhombohedral structure and a tetragonal structure of a solid solution of $A(Zn_xTi_{(1-x)})O_3$ and $AMO_3$ of the present invention. The difference in volume in a unit cell of different crystal systems can be the factor for inhibiting the structural phase change (switching of polarization). When a monoclinic crystal that has an intermediate volume is mixed, the structural phase transition becomes easier and the piezoelectric characteristics are enhanced, compared with only a tetragonal, only a rhombohedral crystal, or a mixed system of the tetragonal and the rhombohedral.

When the perovskite-type complex oxide represented by the general formula (1) has a monoclinic structure in the piezoelectric material of the present invention, the rotation of a polarization axis becomes sensitive to an external electric field, compared with that in other crystal systems. Consequently, the displacement amount by piezoelectricity per intensity of the external electric field becomes large. More specifically, a piezoelectric constant becomes large.

Next, a phenomenon is described in the case where the perovskite-type complex oxide represented by the general formula (1) is one of a mixed system having at least a monoclinic structure and a rhombohedral structure and a mixed system having at least a monoclinic structure and a tetragonal structure. In the case of such a mixed system, each unit cell takes any of the crystal system structures (e.g., a monoclinic structure, a rhombohedral structure, and a tetragonal structure), or an intermediate crystal system structure thereof. Collections of unit cells having different states are mixed to form an entire crystal structure. However, the difference in an energy level in each state is small. Therefore, the transition between the respective states occurs when an external electric field is applied. This transition causes a large piezoelectric displacement due to a change in a crystal system.

It is desired that the piezoelectric material be a film having a thickness of 200 nm to 10 μm both inclusive, and more preferably 300 nm to 3 μm both inclusive and provided on a substrate. By setting the film thickness of the piezoelectric material to 200 nm to 10 μm both inclusive, an electromechanical conversion function sufficient as a piezoelectric device is obtained and the increase in density of the piezoelectric device can be expected.

There is no particular limit to a method of stacking the film. Examples of the method include a chemical solution deposition method (CSD method, may be called sol-gel method), a metal organic chemical vapor deposition method (MOCVD method), a sputtering method, a pulse laser deposition method (PLD method), a hydrothermal synthesis method, and an aerosol deposition method (AD method). Of those, the most preferred stack method is one of the metal organic chemical vapor deposition method and the chemical solution deposition method. The metal organic chemical vapor deposition method and the chemical solution deposition method are film formation methods excellent in precise control of metal composition.

In the present invention, a metal organic chemical vapor deposition method collectively refers to a film formation method of growing an intended metal oxide on a substrate by thermal decomposition of a metal organic compound sent by carrier gas. The metal organic chemical vapor deposition method is also called one of a metal organic vapor phase epitaxy method, an MOCVD method, and an MOVPE method.

The chemical solution deposition method in the present invention collectively refers to a film formation method of obtaining intended metal oxides by applying a precursor solution of the intended metal oxides onto a substrate, followed by heating and crystallization. Generally, the chemical solution deposition method includes film formation methods called a CSD method, a sol-gel method, and an organic metal decomposition method.

Examples of a metal compound to be used in one of the metal organic chemical vapor deposition method and the chemical solution deposition method include a hydrolyzable or thermally degradable metal organic compound. Typical examples thereof include a metal alkoxide of a metal, an organic acid salt, and a metal complex such as a β-diketone complex contained in an intended material.

In the film-shaped piezoelectric material, the range of y is preferably $0.17 \leq y \leq 0.44$. In a composition range in which y is smaller than 0.17, the properties of $AMO_3$ that has a non-tetragonal structure become prevalent. On the contrary, in a composition range in which y is larger than 0.44, the properties of $A(Zn_xTi_{(1-x)})O_3$ become prevalent. When the range of y is $0.17 \leq y \leq 0.44$, the effect of a morphotropic phase boundary between $AMO_3$ and $A(Zn_xTi_{(1-x)})O_3$, that is, the effect of a region where the monoclinic structure is dominant, with the result that piezoelectricity and dielectricity increase. It can be confirmed from the existence of the monoclinic structure in an X-ray diffraction measurement or the like that the composition range is in the vicinity of the morphotropic phase boundary.

Figure 2:
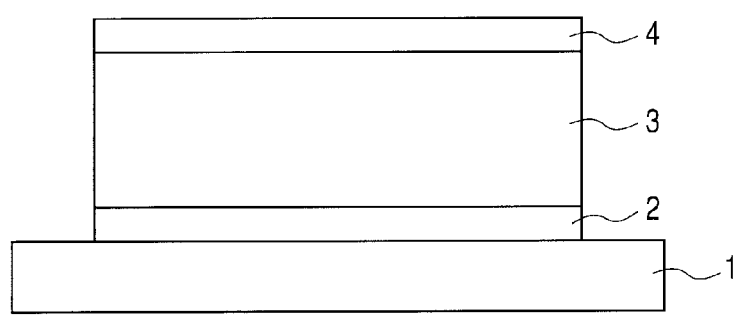
FIG. 2 is a schematic view illustrating a piezoelectric device using a piezoelectric material of the present invention.

FIG. 2 is a schematic view illustrating an example of a piezoelectric device using the piezoelectric material of the present invention. The piezoelectric device shown in FIG. 2 includes a substrate 1, a lower electrode 2, a piezoelectric material 3 of the present invention and an upper electrode 4.

Although there is no particular limit to a material for a substrate 1, a material that is not deformed or melted during a sintering step conducted usually at 800° C. or lower is preferred. For example, a single crystal substrate made of magnesium oxide, strontium titanate, or the like, a ceramic substrate made of zirconia, alumina, silica, or the like, a semiconductor substrate made of silicon (Si), tungsten (W), or the like, or a heat-resistant stainless (SUS) substrate is used preferably. Those materials may be combined in multiple kinds or may be laminated to form a multi-layered configuration. One of a conductive metal and a conductive metal oxide may be doped in a substrate or stacked on the surface of a substrate for the purpose of allowing one of the conductive metal and the conductive metal oxide to additionally function as one of the electrodes of the piezoelectric device.

Of Those substrates, it is preferred that a substrate used in the piezoelectric material of the present invention be a single crystal substrate selectively (001) oriented or (111) oriented.

By using a single crystal substrate with particular orientation, a film-shaped piezoelectric material provided on the surface of the substrate can also be oriented strongly in the same orientation. When the piezoelectric material has (001) orientation or (111) orientation, the moment of polarization is aligned in a direction perpendicular to the film, and hence the enhancement of the piezoelectric effect can be expected.

The lower electrode 2 and the upper electrode 4 are made of an electroconductive layer having a thickness of approximately 5 to 2,000 nm. The material of the electroconductive layer is not particularly limited and may be a material normally used for the piezoelectric device. For example, it includes metals such as Ti, Pt, Ta, Ir, Sr, In, Sn, Au, Al, Fe, Cr, Ni and oxides thereof. The lower electrode 2 and the upper electrode 4 may be formed of one them or one laminated two or more kinds of them. The manufacturing method of the electrodes is not limited. For example, examples of the method include chemical solution deposition method, a metal organic chemical vapor deposition method, a sputtering method, a pulse laser deposition method, a hydrothermal synthesis method, and an aerosol deposition method. Further, the lower electrode 2 and the upper electrode 4 both may be patterned in a desired shape.

The piezoelectric material of the present invention can be used, not limited to the examples mentioned above, in equipment such as an ultrasonic vibrator, a piezoelectric actuator, a piezoelectric sensor, and a ferroelectric memory.

Hereinafter, the present invention is described more specifically by way of examples. However, the present invention is not limited to the following examples.

Examples 1 to 7

A complex metal oxide thin film having a composition corresponding to each example in Table 1 was formed on a substrate by an pulsed metal organic chemical vapor deposition method.

As a substrate on which a thin film is formed, a single crystal substrate made of strontium titanate with (100) orientation having strontium ruthenate with a thickness of about 100 nm on a film formation plane as a lower electrode was used. As an oxide material of each metal, dimethyl(2-(N,N-dimethylaminomethyl)phenyl)bismuth($Bi(CH_3)_2$(2-$(CH_3)_2NCH_2Ph$)), tri(ethylpentadienyl)iron($Fe(C_2H_5C_5H_4)_3$), bis(6-ethyl-2,2-dimethyl-3,5-decanedionate)zinc ($Zn(EDMDD)_2$), and tetra-1-propoxytitanium($Ti(O.i\text{-}Pr)_4$) were used.

Using nitrogen as a carrier gas and using oxygen as a purge gas, film formation was conducted intermittently by suspending the supply of the gases for 5 seconds every time the gases were supplied for 10 seconds. The film formation temperature was set to be 770° C. By conducting film formation in a total of 200 pulses (50 minutes), the piezoelectric material thin film of the present invention with a thickness of 260 nm to 480 nm was obtained.

According to the X-ray diffraction measurement, it was found that any piezoelectric material had a perovskite structure. Further, the crystal system was one of a mixed system having a monoclinic structure and a rhombohedral structure and a mixed system having a monoclinic structure and a tetragonal structure.

A platinum electrode with ϕ 100 μm was provided on the surface of each of the thin film-shaped piezoelectric materials by a sputtering method to obtain a piezoelectric device. The piezoelectric device thus obtained was used for an electric measurement. Table 1 shows the results together with compositions.

Regarding the ferroelectricity shown in Table 1, a mark "o" was given in the case where a hysteresis curve peculiar to a ferroelectric was observed, the curve showing that the spontaneous polarization is inverted by changing the magnitude of an external electric field positively or negatively, when a P-E hysteresis measurement in a temperature range of −60° C. to 30° C. was conducted.

The measurement of a Curie temperature was conducted by an X-ray diffraction apparatus and an impedance analyzer equipped with a heating and cooling unit. The Curie temperature shown in Table 1 was specified by a temperature at which a crystal structure is changed or a temperature at which a dielectric constant exhibits a local maximum, in a range of −150° C. to 330° C.

The measurements of a dielectric constant and a dielectric loss were conducted by an impedance analyzer. As the dielectric constant and the dielectric loss shown in Table 1, numerical values at 25° C. and 1 kHz were used. As all the dielectric constants described herein, the values of a relative dielectric constant, which is the ratio with respect to a vacuum dielectric constant, are described.

Further, regarding the piezoelectric devices using the piezoelectric behavior at d33 mode was measured.

Specifically, the upper electrode on a surface of the material was processed to ϕ100 μm pattern. Minute displacement when voltage was applied to the upper and lower electrodes was measured by scanning type probe microscope (SPM). As a result, displacement corresponding to external electric field was observed in all the piezoelectric materials of Examples 1 to 7. All the piezoelectric d33 constants calculated from displacement amount curve having butterfly shape obtained when the external electric field was changed from −10 V to +10 V were 30 pm/V or more. Maximum value of d33 constant of the piezoelectric material of the present invention was 85 pm/V in Example 3.

Comparative Examples 1 to 5

Metal oxides with intended compositions shown in Table 1 were produced by the pulsed metal organic chemical vapor deposition method in the same way as in Example 1.

Electrodes were formed on the metal oxide materials of Comparative Examples 1 to 5 in the same way as in Example 1, and an electric measurement was conducted. Table 1 shows the results together with the compositions. The metal oxide materials of Comparative Examples 1 to 5 had a dielectric constant smaller than that of the piezoelectric materials of the examples. Further, Comparative Examples 1 and 2 with a small y-value exhibited a large dielectric loss value.

Comparative Example 6

Metal oxides with intended compositions shown in Table 1 were produced by the pulsed metal organic chemical vapor deposition method in the same way as in Example 1.

The composition of Comparative Example 6 was $BiFeO_3$, and was found to have a perovskite structure of a rhombohedral from the X-ray diffraction measurement.

An electrode was formed on the metal oxide material of Comparative Example 6 in the same way as in Example 1, and an electric measurement was conducted. Table 1 shows the results together with the composition. The metal oxide material of Comparative Example 6 had a dielectric constant smaller than that of the piezoelectric materials of the examples and had a dielectric loss larger than that of the examples.

Piezoelectric d33 constant of the metal oxide material Comparative Examples 1 to 6 was measured, similarly Example 1. As a result, d33 constant of 30 pm/V or more was not observed.

TABLE 1

| | A element | M element | x | y | Crystal system | Ferro-electricity | Curie temperature | Dielectric constant | Dielectric loss |
|---|---|---|---|---|---|---|---|---|---|
| Example 1 | Bi 100% | Fe 100% | 0.5 | 0.17 | Rhombohedral + monoclinic | o | 330° C. or higher | 1,400 | 2.5% |
| Example 2 | Bi 100% | Fe 100% | 0.5 | 0.21 | Rhombohedral + monoclinic | o | 330° C. or higher | 1,700 | 2.3% |
| Example 3 | Bi 100% | Fe 100% | 0.5 | 0.24 | Rhombohedral + monoclinic | o | 330° C. or higher | 1,900 | 2.0% |
| Example 4 | Bi 100% | Fe 100% | 0.5 | 0.32 | Monoclinic + tetragonal | o | 330° C. or higher | 1,800 | 1.2% |
| Example 5 | Bi 100% | Fe 100% | 0.5 | 0.40 | Monoclinic + tetragonal | o | 330° C. or higher | 1,600 | 1.1% |
| Example 6 | Bi 100% | Fe 100% | 0.5 | 0.44 | Monoclinic + tetragonal | o | 330° C. or higher | 1,500 | 1.2% |
| Example 7 | Bi 100% | Fe 100% | 0.5 | 0.60 | Monoclinic + tetragonal | o | 330° C. or higher | 1,300 | 1.2% |
| Comparative Example 1 | Bi 100% | Fe 100% | 0.5 | 0.11 | Rhombohedral | o | 330° C. or higher | 600 | 3.3% |
| Comparative Example 2 | Bi 100% | Fe 100% | 0.5 | 0.15 | Rhombohedral | o | 330° C. or higher | 800 | 3.1% |
| Comparative Example 3 | Bi 100% | Fe 100% | 0.5 | 0.61 | Tetragonal | o | 330° C. or higher | 1,100 | 1.2% |
| Comparative Example 4 | Bi 100% | Fe 100% | 0.5 | 0.65 | Tetragonal | o | 330° C. or higher | 1,000 | 1.2% |
| Comparative Example 5 | Bi 100% | Fe 100% | 0.5 | 0.68 | Tetragonal | o | 330° C. or higher | 900 | 1.0% |
| Comparative Example 6 | Bi 100% | Fe 100% | — | 0 | Rhombohedral | o | 330° C. or higher | 200 | 5.8% |

According to Table 1, all the piezoelectric materials of the present invention exhibit ferroelectricity. More specifically, it is understood that all the materials in Examples 1 to 7 have piezoelectricity. Further, all the piezoelectric materials of the present invention have a Curie temperature of 330° C. or higher, and exhibit stable electric characteristics in a temperature range of −150° C. to 330° C.

Further, each of the piezoelectric materials of the present invention exhibits a dielectric constant larger than those of metal oxides of the comparative examples, which suggests that the piezoelectric materials of the present invention are also more excellent in piezoelectric performance.

The piezoelectric material of the present invention is also applicable to an MEMS technique, exhibits satisfactory piezoelectricity even at a high temperature, and is clean to the environment. Therefore, the piezoelectric material of the present invention can be used for appliances using many piezoelectric materials, such as an ultrasonic motor and a piezoelectric device without any problems.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-001964, filed Jan. 7, 2009, which is hereby incorporated by reference herein in its entirety.

The invention claimed is:

1. A piezoelectric material comprising a crystal system which contains at least a monoclinic structure and which is represented by general formula (1):

$$A(Zn_xTi_{(1-x)})_yM_{(1-y)}O_3 \quad (1),$$

where A represents a Bi element, M represents at least one element selected from Fe, Al, Mn, Y, Ga, and Yb; x represents a numerical value of $0.4 \leq x \leq 0.6$; and y represents a numerical value of $0.17 \leq y \leq 0.60$, wherein the piezoelectric material is a film having a thickness of from 200 nm to 10 μm and is formed on a substrate, and wherein the piezoelectric material is formed by a metal organic chemical vapor deposition method.

2. The piezoelectric material according to claim 1, wherein the crystal system of the piezoelectric material further contains a rhombohedral structure.

3. The piezoelectric material according to claim 1, wherein the crystal system of the piezoelectric material further contains a tetragonal structure.

4. The piezoelectric material according to claim 1, wherein a range of y is $0.17 \leq y \leq 0.44$.

5. The piezoelectric material according to claim 1, wherein a Curie temperature of the piezoelectric material is from 450° C. to 600° C.

6. The piezoelectric material according to claim 1, wherein the substrate is a single crystal substrate selectively (001) oriented or (111) oriented.

7. A piezoelectric device comprising the piezoelectric material according to claim 1.

* * * * *

UNITED STATES PATENT AND TRADEMARK OFFICE
CERTIFICATE OF CORRECTION

| | | |
|---|---|---|
| PATENT NO. | : 8,980,117 B2 | Page 1 of 1 |
| APPLICATION NO. | : 13/142602 | |
| DATED | : March 17, 2015 | |
| INVENTOR(S) | : Makoto Kubota et al. | |

It is certified that error appears in the above-identified patent and that said Letters Patent is hereby corrected as shown below:

ON TITLE PAGE AT (22) PCT Filed:

"Jan. 1, 2010" should read --Jan. 6, 2010--.

Signed and Sealed this
Twenty-eighth Day of July, 2015

Michelle K. Lee
*Director of the United States Patent and Trademark Office*